Jan. 31, 1956 B. F. GRIB 2,732,748

TEMPERATURE COMPENSATION FOR TUNING FORKS

Filed June 30, 1950

INVENTOR.
B. F. GRIB
BY Darby & Darby
ATTORNEYS

United States Patent Office 2,732,748

Patented Jan. 31, 1956

2,732,748

TEMPERATURE COMPENSATION FOR TUNING FORKS

Boris F. Grib, Brooklyn, N. Y., assignor to Philamon Laboratories, Inc., Westbury, N. Y., a corporation of New York Application June 30, 1950, Serial No. 171,480

10 Claims. (Cl. 84—457)

The present invention relates to improvements in tuning forks and more particularly to improvements in the construction of tuning forks adapted to be electrically vibrated, such as tuning forks which serve as frequency-determining elements for electrical oscillation generators.

As is well known, a tuning fork constitutes a resonant system and its vibrations can be utilized to determine the frequency of electrical oscillations produced by an electrical or electronic circuit suitably coupled to the tuning fork. In producing oscillations in this manner, an important problem has been that of temperature compensation, since temperature variations to which the tuning fork may be exposed tend to alter the resonant frequency of the tuning fork and consequently alter the output frequency of the apparatus, producing temperature-sensitive frequency instability.

According to one aspect of the present invention, special means are provided in a tuning fork to substantially prevent or minimize the variations in frequency of the fork over a relatively wide temperature range. For example, by the use of the present invention, tuning forks can be designed for vibration at frequencies up to about 4,000 cycles per second which will vary in frequency not more than one part in 10,000 over a temperature range of —40° C. to +60° C.

This is done in accordance with the present invention by providing temperature-responsive elements at the ends of the tines of the tuning fork, which respond to temperature change in a manner which compensates for the effect of that temperature change upon the resonant frequency of the fork. While this is not broadly novel, my invention is more specifically directed toward particular ways of mounting and arranging the temperature sensitive compensating elements so as to permit easy manufacture and to attain consistently the results mentioned previously.

Another problem encountered in the construction and use of tuning fork frequency standards is the problem of isolating the vibration of the fork tines from the mount which supports the fork. If the fork tines are unbalanced or improperly mounted, vibration is transmitted to the mount. This results in a decrease in the energy available for vibrating the tines themselves and constitutes a form of damping for the system which reduces the effective Q of the system in an undesired manner. In addition, when vibrations are transmitted to the mount, often some portion of the mount or other elements affixed to it are also set into vibration which is transmitted back to the tines through the medium of the atmosphere, in the cases where the tuning fork is not vacuum mounted. This creates a type of feedback which also alters the frequency of oscillation of the tines undesirably.

According to another feature of the present invention special arrangements are provided for minimizing this transmission of vibration to the mount. I have discovered that when initially struck a tuning fork emits a tone of a frequency different from that produced during steady vibration. This tone I have termed the "reed" frequency as distinguished from the fork frequency during steady vibration. I have further discovered that the undesirable effects of the transmission of vibration to the mount can be avoided by proper design of the fork so as to produce a reed frequency less than the fork frequency but more than half the fork frequency. As a practical matter, I have found that the reed frequency should be between 60 and 85% of the fork frequency.

I have also discovered that the reed frequency can be varied without substantial change in the fork frequency by reducing the cross-section of the tuning fork at the base of the tines. By the present invention simple ways of restricting the cross-section of the fork base are utilized, specifically designed according to this invention to produce a reed frequency in the range specified so as to provide improved results.

These and other features and objects and advantages of the present invention will become more apparent from consideration of the following specification and the appended drawings, wherein.

Figures 1, 2, 3, 4, 5, 6:
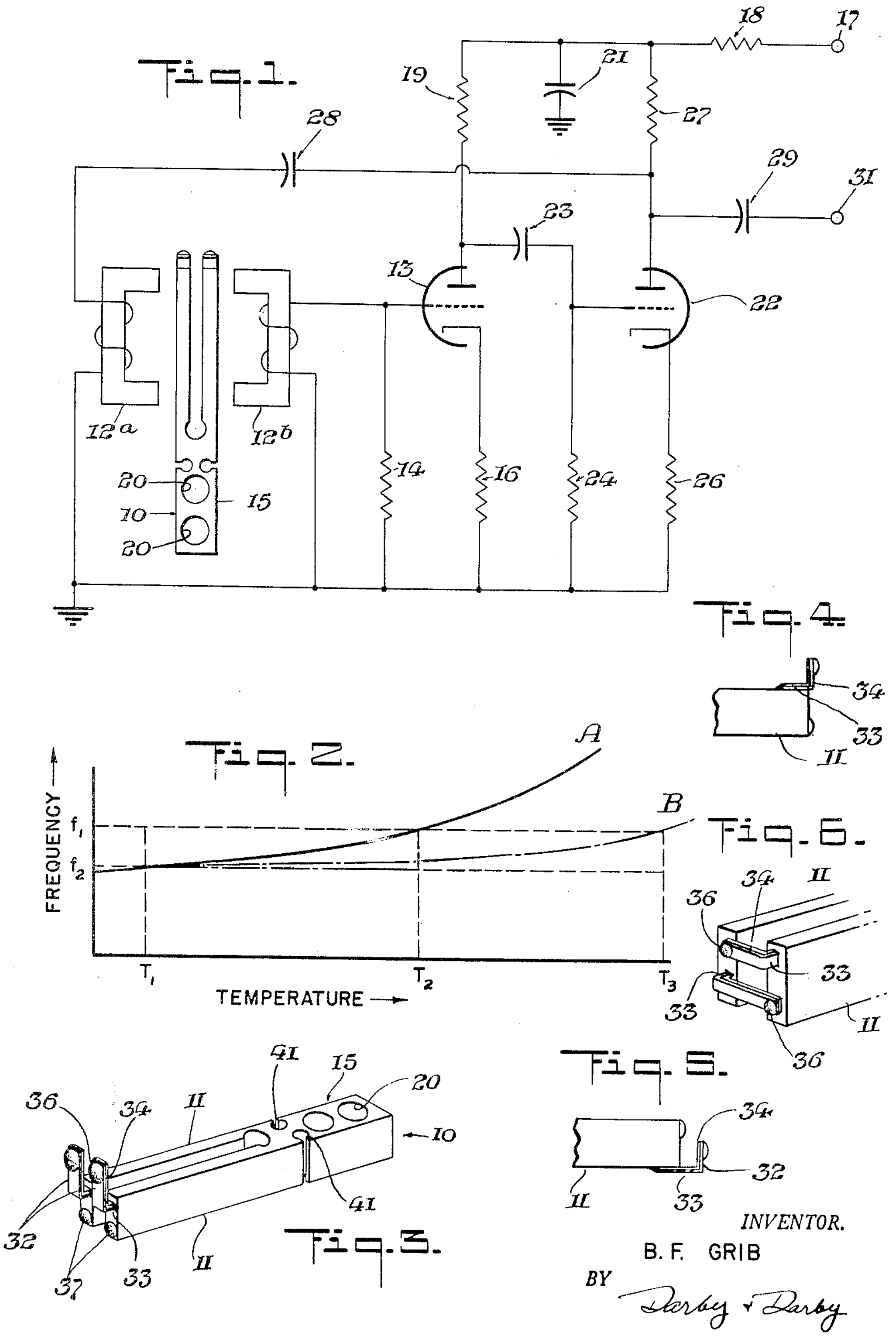
Figure 1 is a schematic representation of my improved tuning fork and an associated electronic circuit.
Figure 2 is a graph useful in explaining the operation of the invention.
Figure 3 is a perspective view of my improved tuning fork.
Figures 4 and 5 are fragmentary side elevation views of modified forms of my tuning fork.
Figure 6 is a fragmentary perspective view of another modified form.

Referring to the drawing, Figure 1 shows a tuning fork 10 and its associated circuit. Adjacent to the tines 11 of the tuning fork 10 are driving and pickup coils, 12*a*, 12*b*, each shown as formed by a magnetic core and an electrical winding thereon. While single coils 12*a*, 12*b* are shown, it will be understood that they may be sectionalized if desired, and each coil may have sections on both tines. The pickup coil 12*b* is coupled to the input circuit of an electron tube 13 having a grid leak 14 and a cathode resistor 16. The anode of tube 13 is supplied from a source of positive potential indicated schematically by the terminal 17, through a voltage dropping resistor 18 and a load resistor 19. A filtering condenser 21 serves to stabilize the voltage applied to the load resistor 19. The output of tube 13 is fed to a second tube 22 through a coupling condenser 23 and an input resistor 24. Tube 22 also has a cathode resistor 26 and a load resistor 27, which is coupled to the junction of voltage-dropping resistor 18 and filter condenser 21 so as to be supplied with anode voltage from source 17. The anode of tube 22 is coupled through condenser 28 to the driving coil 12*a*, and the output oscillations are derived from terminal 31 coupled to the anode of tube 22 through a coupling condenser 29.

In operation tubes 13 and 22 operate as a two-stage amplifier with feedback through condenser 28 and the tuning fork itself providing regeneration to produce self-oscillations. The system is such that oscillation can occur substantially only at the resonant frequency of the tuning fork 10. The system is extremely simple and compact since the tubes 13 and 22 may be separate sections in a single envelope, and the resistors and condensers are simple and inexpensive elements taking up little space.

The heart of the present invention, and the element which assures the results characteristic of this apparatus, is the tuning fork 10. As shown in Figures 1 and 2, the fork 10 is formed with a pair of tines or legs 11 and a base 15 which is apertured at 20 for mounting.

For example, the temperature characteristic of a particular tuning fork now being used is shown by the solid curve A of Figure 2. Thus, as the temperature increases from a relatively low temperature value, the resonant frequency of the tuning fork (and hence, the output frequency of the oscillation generator of Figure 1) increases. For any particular use to which the oscillation generator is to be put, only a predetermined range of frequency change can be tolerated, as, for example, the range between the frequencies $f_1$ and $f_2$. As shown by the curve A, this frequency range therefore limits the utility of the apparatus to the temperature range between temperatures $T_1$ and $T_2$.

As shown in Figure 2, to extend this temperature range to some higher temperature such as $T_3$, it is necessary for the curve to assume a configuration such as shown by the dash-dot curve B. This is done according to the present invention by providing special temperature compensation means at the end of each of the tines 11. For this purpose, affixed at the end of each tine 11 is a bi-metallic element 32 bent in a right angle to form two legs 33 and 34. One leg 33 is affixed at the end of the tine 11 as an extension thereof, as shown most clearly in Figure 3, so that the other leg 34 extends transversely of the length of the tine 11. The leg 33 is preferably fastened at the end of tine 11 by being abutted against it and soldered, welded or otherwise affixed thereto.

Each leg 34 carries a weight 36 near the end thereof. This weight is preferably constituted by a droplet of solder, so that the weight can readily be varied, as by filing away or adding more solder. A similar droplet of solder 37 is fixed to the end of each tine 11.

In operation, upon a change in temperature, the bi-metallic leg 34 will bend, as is customary with such elements. In so doing the distance between the weight 36 and the base 15 is varied. Shown by curve A of Fig. 2, upon an increase in temperature the frequency of resonant vibration of the fork increases. The bi-metallic elements 32 are mounted so that upon such an increase of temperature the weight 36 moves away from the base 15. This tends to lengthen the effective length of the tines at the same time as increase in temperature tends to increase frequency of vibration and in this way a compensating effect is attained.

As indicated above, the weights 37 and 36 are preferably made of soft solder which can be readily filed for adjustment. In general, weights 37 determine the actual frequency of resonance of the fork (and hence determine the output frequency of the oscillation generator of Figure 1) and weights 36 determine the degree of compensation. In addition, the two weights 37 provide a means for balancing the two tines 11 to minimize vibration of the mount.

In actual operation, the adjustment of weights 36 and 37 is performed while the fork is connected in an oscillation generator circuit such as in Figure 1, with the output coupled to a frequency indicator. After each readjustment of weights 37, it is therefore very simple to start the generator and check the results of such adjustment.

The particular mounting of the bi-metallic element 32 using the right-angled legs 33 and 34 is of peculiar advantage here, since it renders the bending of the bi-metallic leg 34 essentially independent from the affixing of the leg 33 to the tine 11. Thus, during production, unavoidably different amounts of solder, cement weld or the like will be used for different tuning forks or different tines of the same fork. By bending the element 32 at right-angles shown, the only part which has an appreciable effect on compensating the vibrating frequency of the fork is the leg 34, which is spaced from and independent from the mounting of the leg 32 on the tine 11. This permits ready duplication of the improved results attainable by use of the invention, as is necessary for production purposes.

It will be understood that the frequency compensation available is determined by the weights 36 and the degree of movement of these weights, which in turn, for a given bi-metallic material, depends upon the length of legs 34. For best performance, each leg 34 and its weight 36 are selected to have a self-resonant vibration (as a cantilever system) of at least 10 times the desired fork frequency. In this way the leg 34 is substantially rigid during operation, and any resilience it may have will not influence the operation of the generator.

For the purpose of improving the isolation of the vibrating tines from the mount, recourse is had to the slots 41 placed between the mounting holes 20 of the base 15 and the vibrating tines 11. These slots 41 are formed simply by drilling holes symmetrically about the center line or longitudinal axis of the fork, and then sawing out the outer faces of these holes as indicated. The size of these holes and their spacing determines the reed frequency mentioned above. The size of the holes is determined experimentally for a given size of a tuning fork, and fine adjustments may be made by filing the edges or bottoms of these slots 41 to provide a reed frequency between 60 and 85% of the fork frequency, which has been determined as the value necessary to isolate the fork tine vibrations from the base or mount. According to this feature of the present invention and as shown in the drawings, for the reed frequency to be less than the fork frequency, the thickness of the narrow section adjoining the tines to the base 15 of the fork must be less than the sum of the thicknesses of the narrowest portions of the tines at which their cantilever bending occurs.

It will be understood that values at the center of the range of reed frequencies given are the best, since if the reed frequency approaches too closely the fork frequency, intercoupling appears to take place between these two frequencies which reduces the isolation desired. In addition, if the reed frequency approaches a sub-harmonic (for example, half) of the fork frequency, similar interaction appears to take place. It is therefore necessary that the reed frequency avoid both the fork frequency and subharmonics thereof.

Figure 4 illustrates a modification of the arrangement of Figure 3, in which the compensating element 32 has its longitudinal extending leg 33 mounted flat against the upperside of the tine 11. It will be understood that the action here is the same as that of the device of Figure 3, since essentially only the leg 34 contributes to the compensation and the movement of this leg 34 is independent of the mounting of the element 32 upon the tine.

Figure 5 shows a similar arrangement in which the leg 34 is mounted on the underside of the tine 11 with the leg 33 again extending flat along the tine 11 and affixed thereto. This form is essentially the same as that of Figure 4 except that a smaller overall depth of fork exists.

Figure 6 shows another form similar to Figure 3, but with the bimetallic element legs 34 extending at right angles to their direction in Figure 3. To accommodate the length of legs 34, they may be in staggered relation as shown.

While the invention has been illustrated as applied to tuning forks whose frequency normally increases with increase in temperature, it will be understood that with certain materials the frequency decreases upon increase of temperature. The present invention is still applicable and compensation can be attained by reversing the direction of flexure of the bimetallic strips so that the masses 36 move toward the base 15 on increase of temperature.

While several illustrative forms of the invention have been shown, it is to be understood that the invention is not to be considered limited thereto, because many apparently divergent embodiments of the invention can be easily conceived within the spirit thereof. Therefore, the invention is to be limited only as defined in the appended claims.

What is claimed is:

1. A temperature compensated tuning fork having a pair of tines and a temperature responsive element affixed adjacent the end of each tine, said element comprising a bi-metallic strip having two legs at right-angles to one another, one of said legs being parallel to the longitudinal axis of its respective tine, and having one end affixed adjacent the end of its respective tine, the other leg being perpendicular to said axis.

2. A temperature compensated tuning fork as in claim 1, further including a weight carried by said perpendicular element leg adjacent the end thereof.

3. A temperature compensated tuning fork as in claim 2 further including a weight affixed to the end of each of said tines.

4. A temperature compensated tuning fork as in claim 1, wherein said parallel element leg is directly affixed to and abutted against the end of its respective tine to form an effective extension thereof.

5. A temperature compensated tuning fork as in claim 1, wherein said parallel element leg is affixed to one side of its respective tine.

6. A temperature compensated tuning fork having a pair of tines and a temperature responsive element affixed adjacent the end of each tine, each said element comprising a bi-metallic strip having a pair of perpendicularly disposed legs, one of said legs being affixed adjacent the end of its respective tine and extending parallel to the longitudinal axis thereof and the other leg being perpendicular to said axis, the other of said legs having a resonant frequency of vibration of at least ten times the frequency of vibration of said fork.

7. A temperature compensated tuning fork having a pair of tines and a temperature responsive element affixed at the end of each tine, each such element comprising a bi-metallic strip projecting outwardly from the end of the tine along the axis of the tine and with a portion extending at right angles to said axis.

8. A temperature compensated tuning fork as in claim 7, further including a weight carried by each such bi-metallic strip at the end thereof remote from its point of affixation to its respective tine.

9. A temperature compensated tuning fork as in claim 8, additionally including a weight affixed to the end of each of said tines.

10. A temperature compensated tuning fork as in claim 7, further including a weight affixed to the end of each of said tines.

References Cited in the file of this patent

UNITED STATES PATENTS

| | | |
|---|---|---|
| 27,288 | Hill et al. | Feb. 28, 1860 |
| 329,090 | Segrove | Oct. 27, 1885 |
| 1,545,251 | Gent | July 7, 1925 |
| 1,653,794 | Whitehorn | Dec. 27, 1927 |
| 1,880,923 | Eisenhour | Oct. 4, 1932 |
| 1,912,343 | Buckingham | May 30, 1933 |
| 1,935,215 | Severy | Nov. 14, 1933 |
| 1,937,583 | Norrman | Dec. 5, 1933 |
| 2,147,492 | Mead, Jr. | Feb. 14, 1939 |
| 2,433,160 | Rusler | Dec. 23, 1947 |
| 2,529,430 | Stanton | Nov. 7, 1950 |

FOREIGN PATENTS

| | | |
|---|---|---|
| 5,483 | Great Britain | Nov. 18, 1882 |
| 914,917 | France | July 1, 1946 |